United States Patent
Fülöp et al.

(10) Patent No.: US 6,570,332 B1
(45) Date of Patent: May 27, 2003

(54) ELECTRODE-TO-BALLAST INTERCONNECT OF FLAT INTEGRAL TYPE COMPACT FLUORESCENT LAMP

(75) Inventors: József Fülöp, Budapest; Sándor Lukács, Verőce; Ákos Ocsovai, Budapest; Ferenc Papp, Budapest; István Würsching, Budapest, all of (HU)

(73) Assignee: General Electric Company, Schenectady, NY (US)

( * ) Notice: Subject to any disclaimer, the term of this patent is extended or adjusted under 35 U.S.C. 154(b) by 256 days.

(21) Appl. No.: 09/596,509

(22) Filed: Jun. 19, 2000

(51) Int. Cl.⁷ .................................................. H01J 5/50
(52) U.S. Cl. ...................... 315/56; 315/58; 313/318.01; 313/318.02
(58) Field of Search .............................. 315/56, 58, 71, 315/70; 313/318.03, 318.05, 318.07, 318.01, 318.02; 362/216

(56) References Cited

U.S. PATENT DOCUMENTS 4,458,301 A    7/1984  Chapman et al. ........... 362/216
5,627,433 A    5/1997  Fulop et al. .................... 315/56
5,834,884 A  * 11/1998  Roberts et al. ........ 313/318.01

* cited by examiner

Primary Examiner—David Vu

(57) ABSTRACT

An electrode-to-ballast interconnect is provided in combination with a fluorescent lamp including a discharge tube bent substantially in a plane. The discharge tube is shaped at least in part to define a substantial portion of the boundary of a zone in the plane. The part of the tube defining the boundary includes at least one straight portion. The discharge tube has a symmetry axis in the plane and sealed tube ends provided with electrodes, and the tube ends re-enter said zone. A base housing is laid within said zone and receives the tube ends. The base housing includes a ballast circuit which is located at least partly on a circuit board positioned substantially parallel to the plane. The electrode-to-ballast interconnect comprises electrode-in-leads which are connected to each electrode and embedded in the tube ends. Terminals are anchored in and protruding from the circuit board. The electrode-in-leads are pre-formed to a shape suitable for connecting to the terminals. Means is formed in the circuit board for urging the electrode-in-leads to the terminals during assembly. The electrode-in-leads and the terminals are joined electrically and mechanically. The base housing protrudes at most half of the outer diameter of the discharge tube from the space defined thereby.

11 Claims, 4 Drawing Sheets

ELECTRODE-TO-BALLAST INTERCONNECT OF FLAT INTEGRAL TYPE COMPACT FLUORESCENT LAMP

FIELD OF THE INVENTION

This invention relates to an electrode-to-ballast interconnect of integral type compact fluorescent lamps with a discharge tube bent substantially in a plane, and, more particularly, a flat compact fluorescent lamp construction with built-in electronic ballast.

BACKGROUND OF THE INVENTION

A flat compact fluorescent lamp construction of 2D type is disclosed in U.S. Pat. No. 4,458,301. This denomination of type originates from the shape of the glass discharge tube which resembles two upper case D letters standing in a mirror symmetry next to each other in a plane. When manufacturing these lamps, a straight tube, the inner portion of which is provided with phosphor coating, is used as a starting point. Stems mounted with electrodes and embedding electrode-in-leads and having a flared portion are sealed in both ends of the straight tube which is filled with a noble gas and additive during the sealing process. Subsequently, the straight tube is bent to a 2D shape. Owing to this manufacturing process, the electrode-in-leads embedded in the ends of the discharge tube are badly arranged. The electrode-in-leads may take up any position in the course of manufacturing so that an automated assembly of the discharge tube with the wires and a ballast circuit located in a base housing is limited. The base housing is positioned in a zone the boundary of which is defined by the discharge tube bent in the plane, and the ballast circuit is disposed on a circuit board which is substantially parallel to this plane. Although the electrode-in-leads are badly arranged, they extend from the tube ends substantially parallel to the plane of the circuit board. The problem arises how to usher the electrode-in-leads to the ballast circuit terminals located on the circuit board.

One solution to this problem is described in U.S. Pat. No. 5,627,433. In this solution, the electrode-in-leads of a compact fluorescent lamp, which also extend from the discharge tube parallel to the circuit board, are electrically connected to the ballast circuit by means of a mechanical connector component anchored in the circuit board. The barrel-like mechanical connector components receive and clamp the electrode-in-leads bent perpendicularly to the plane of the circuit board. Although this electrode-to-ballast interconnect results in a reliable electrical and mechanical connection, it suffers from drawbacks. Due to the complex nature and the small size of the mechanical connector component, an unduly precise electrode-in-lead positioning and pre-forming are required. Simultaneously, a precondition of forming faultless and reliable connection is that the tools of the high-speed automatic assembly machine used for positioning and inserting the leads work precisely.

The base housing of the compact fluorescent lamp construction of 2D type, which is disclosed in U.S. Pat. No. 4,458,301, protrudes from the plane of the discharge tube significantly and reduces the flatness of the lamp. The lamp fixtures accommodating these type of lamps however require a lamp which is as flat as possible.

Thus there is a particular need for an interconnect between the electrode-in-leads and the ballast circuit of a 2D type compact fluorescent lamp the manufacturing of which may be easily automated, provides a reliable connection and allows the base housing of the lamp to merge in the space defined by the discharge tube as much as possible.

BRIEF SUMMARY OF THE INVENTION

As an exemplary embodiment of the invention, an electrode-to-ballast interconnect is provided in combination with a fluorescent lamp including a discharge tube bent substantially in a plane. The discharge tube is shaped at least in part to define a substantial portion of the boundary of a zone in the plane. The part of the tube defining the boundary includes at least one straight portion. The discharge tube has a symmetry axis in the plane and sealed tube ends provided with electrodes, and the tube ends re-enter said zone. A base housing is laid within said zone and receives the tube ends. The base housing includes a ballast circuit which is located at least partly on a circuit board positioned substantially parallel to the plane. The electrode-to-ballast interconnect comprises electrode-in-leads which are connected to each electrode and embedded in the tube ends. Terminals are anchored in and protruding from the circuit board. The electrode-in-leads are pre-formed to a shape suitable for connecting to the terminals. Means is formed in the circuit board for urging the electrode-in-leads to the terminals during assembly. The electrode-in-leads and the terminals are joined electrically and mechanically. In an exemplary embodiment of another aspect of the invention, an integral type compact fluorescent lamp comprises a base housing which is a flat body disposed at least partly within the space defined by the discharge tube. The base housing protrudes at most half of the outer diameter of the discharge tube from the space. At least one support arm extends from the base housing and is attached to a straight portion of the discharge tube. The part of the discharge tube, which defines the boundary, includes three straight portions to form a substantially rectangular zone and the tube ends re-enter the rectangular zone at the fourth side.

This construction has a number of advantages. One advantage over the prior art represented by U.S. Pat. No. 5,627,433 is that the electrode-to-ballast interconnect according to the present invention has a relatively simple and consequently a robust structure. This robust construction permits the manufacturing process of the interconnect to be easily automated and provides a reliable joint between the electrode-in-leads and the terminals of the ballast circuit. The electrode-in-leads of the compact fluorescent lamp described by U.S. Pat. No. 5,627,433 are less badly arranged than the electrode-in-leads of a 2D type lamp since they are embedded in pinch seals after bending the discharge tube. The pinch seals orientate the electrode-in-leads at a certain extent. Another advantage of the present invention with respect to U.S. Pat. No. 4,458,301 is that, even in the event of badly arranged electrode-in-leads, the structure of the electrode-to-ballast interconnect ensures a possibility of easy automation and a reliable electrical joint owing to the pre-forming of the electrode-in-leads and the means for urging the electrode-in-leads to the ballast terminals during assembly. These means are formed in the circuit board located substantially parallel to the plane in which the discharge tube is bent which, in turn, allows the base housing to be formed as flat as possible and to merge in the space defined by the discharge tube as much as possible. This is a basic advantage of the provided integral type compact fluorescent lamp, i.e. a lamp construction with built-in ballast circuit.

DETAILED DESCRIPTION OF THE INVENTION

Figure 1:
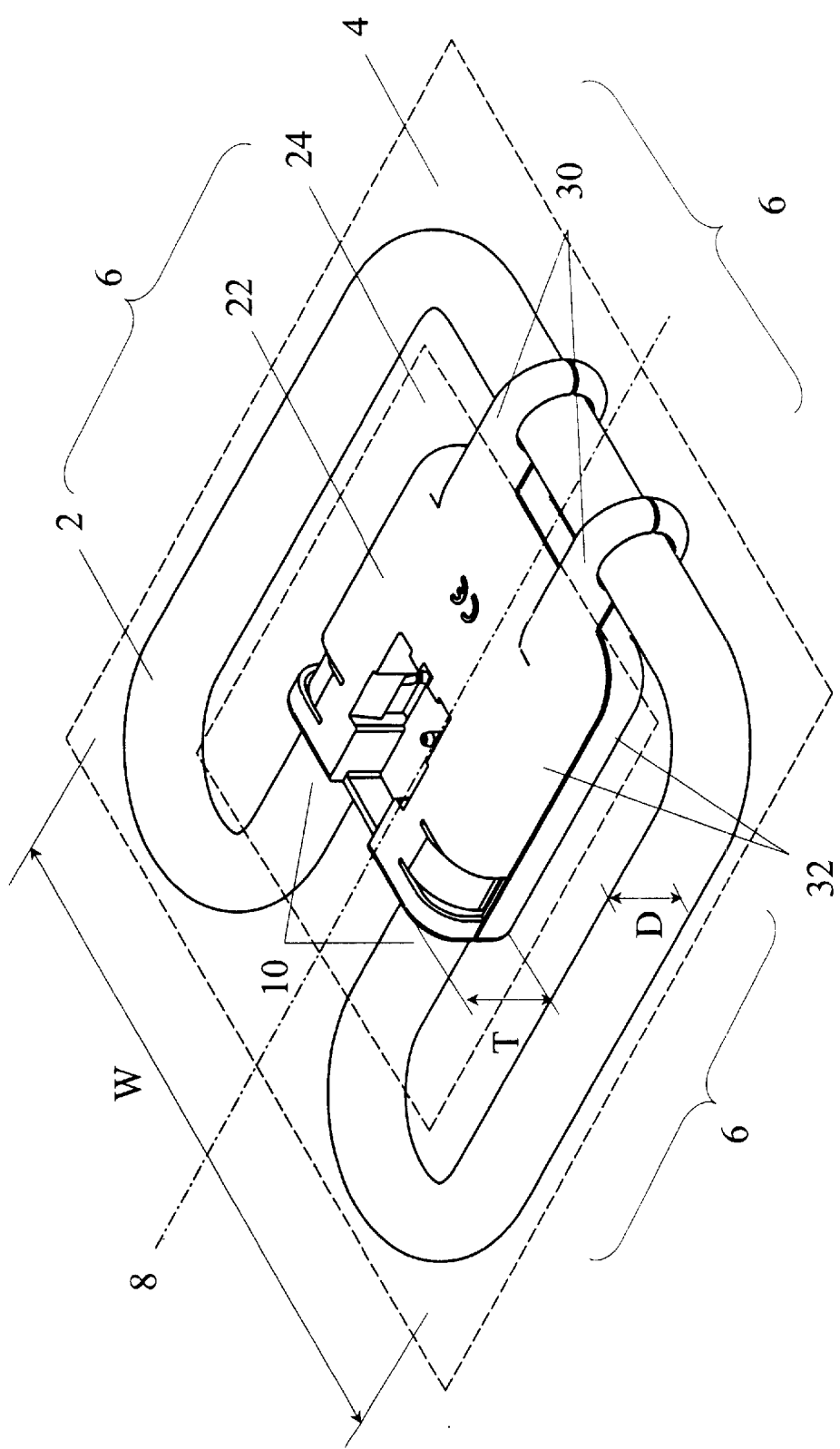
FIG. 1 shows a perspective view of a fully assembled compact fluorescent lamp in which the present invention is embodied.

FIG. 1 shows a fully assembled lamp which includes a low-pressure discharge tube 2. The discharge tube 2, as it is known for a person skilled in the art, is provided with fluorescent coating on its inside wall and suitable gaseous components for arc discharge. The tube 2 is bent substantially in a plane and shaped at least in part to define a substantial portion of the boundary 4 of a zone 24 in the plane. In the exemplary embodiment illustrated by the figure, the tube 2 defining the boundary 4 includes three straight portions 6 shaped to form three sides of a rectangle, and has a symmetry axis 8 in the plane. Tube ends 10 are re-entrant symmetrically into the zone 24 at the fourth side of the rectangle and are received in a base housing 22 which is made of plastic and lies within the zone 24. The base housing 22 has two support arms 30 protruding therefrom and is attached to the straight portion 6 extending substantially perpendicularly to the symmetry axis 8. The support arms 30 prevent the discharge tube 2 from cracking when putting the lamp into a socket (not shown) by limiting relative movement of the discharge tube 2 and the base housing 22. The base housing 22 includes two complementary shells 32 fixed to each other and carries means suitable for mechanically and electrically connecting to the socket. In this embodiment, a suitable shaped cavity and contact pins provide for mechanical and electrical connection, respectively. The base housing 22 has a flat body with a thickness T and is disposed at least partly within the space defined by the discharge tube 2 and protrudes at most half of the outer diameter D of the discharge tube 2 from this space. Under the space defined by the discharge tube 2, a space is understood the boundary of which includes the discharge tube 2 itself and the planes laid on the discharge tube 2 parallel to the plane in which it is bent. The width W of the lamp measured perpendicularly to the symmetry axis 8 and the thickness T of the lamp measured perpendicularly to the plane in which the discharge tube 2 is bent satisfies the relationship W/T=5.5–6.5. As it is seen, the base housing 22 merges in the space defined by the discharge tube 2 as much as it is possible.

Figure 2:
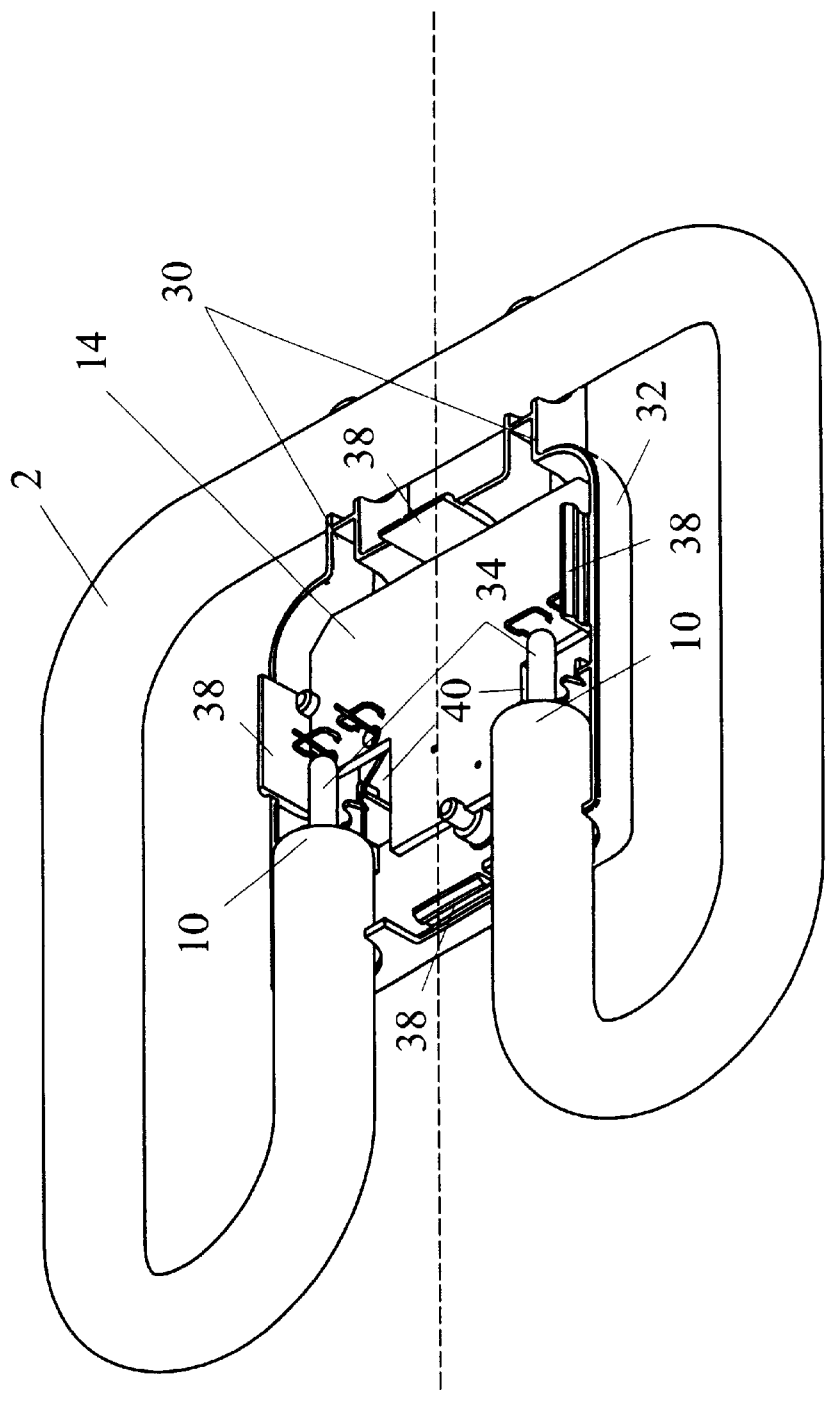
FIG. 2 shows the compact fluorescent lamp with a lower shell of a base housing.

Referring now to FIG. 2, this figure shows the assembled lamp when the upper shell 32 is removed. The complementary shells 32 are connected to each other by tabs 38 protruding from the wall of the lower shell 32 and grooves formed in the wall of the upper shell 32. The tabs 38 have ribs which snap into the grooves of the upper shell 32 while joining the two complementary shells 32. The tube ends 10 may be fixed to a portion of the lower shell 32 by an adhesive or cement hardening by heat and are sealed in a gas-tight manner. Exhaust tubes 34 protrude from the tube ends 10 centrally to the discharge tube 2. In the lower shell 32, a circuit board 14 is placed holding at least a part of the ballast circuit (not shown). The ballast circuit may have components located in suitable places of the base housing outside the circuit board 14. The circuit board 14 has a substantially rectangular shape and its plane is parallel to the plane in which the discharge tube 2 is bent. One side of the circuit board 14 is positioned substantially perpendicularly to the symmetry axis 8, and substantially square shaped symmetrical indentations 40 are formed close to the tube ends 10 at two other sides of the circuit board 14. The indentations 40 allow the circuit board 14 to be placed at the bottom of the lower shell 32. Since the discharge tube 2 is put in place in the lower shell 32 previously, the circuit board 14 would hit the exhaust tubes 34 when it is moved perpendicularly to its plane during assembly if the indentations 40 were not formed therein.

Figure 3:
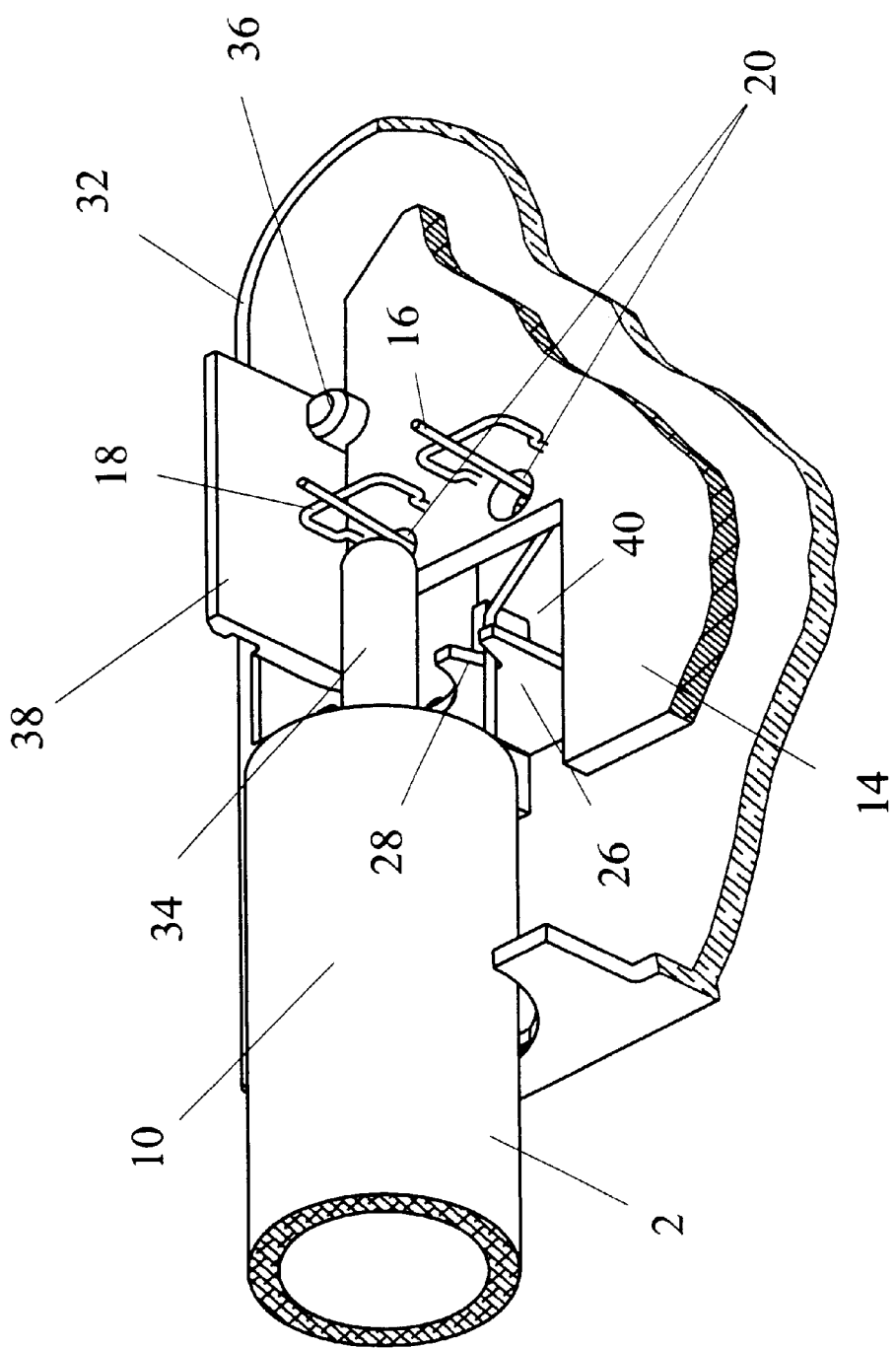
FIG. 3 shows an interconnect of the discharge tube and the ballast in a perspective view.

FIG. 3 illustrates the vicinity of a tube end 10 exposing the tube end 10 itself with its exhaust tube 34 and a fraction of the circuit board 14 and the lower shell 32 with a tab 38. Electrode-in-leads 16, which are connected to an electrode of the discharge tube 2 and embedded in the sealed tube end 10 in a manner known to a person skilled in the art, are led through slots 28 formed on a top portion of looms 26 and holes 20 formed in the circuit board 14 on the side thereof facing to the tube ends 10. The looms 26 protrude from the bottom of the lower shell 32 under the indentation 40 of the circuit board 14 and hold the electrode-in-leads 16 between the tube ends 10 and the circuit board 14. The ends of the electrode-in-leads 16 are welded to terminals 18 which have bridge-like shape with legs and are anchored in and protrude from the circuit board 14. The electrode-in-leads 16, the looms 26 with their slots 28, the holes 20 and the terminals 18 establish an electrode-to-ballast interconnect joining the electrodes of the tube 2 and the ballast circuit. The circuit board 14 holding at least a part of the ballast circuit is fixed in the lower shell 32 by studs 36 protruding from the wall of the shell 32. The studs 36 hold the circuit board 14 in place by snapping onto its edge while the circuit board 14 is being pushed in place in the shell 32 during assembly.

Figure 4:
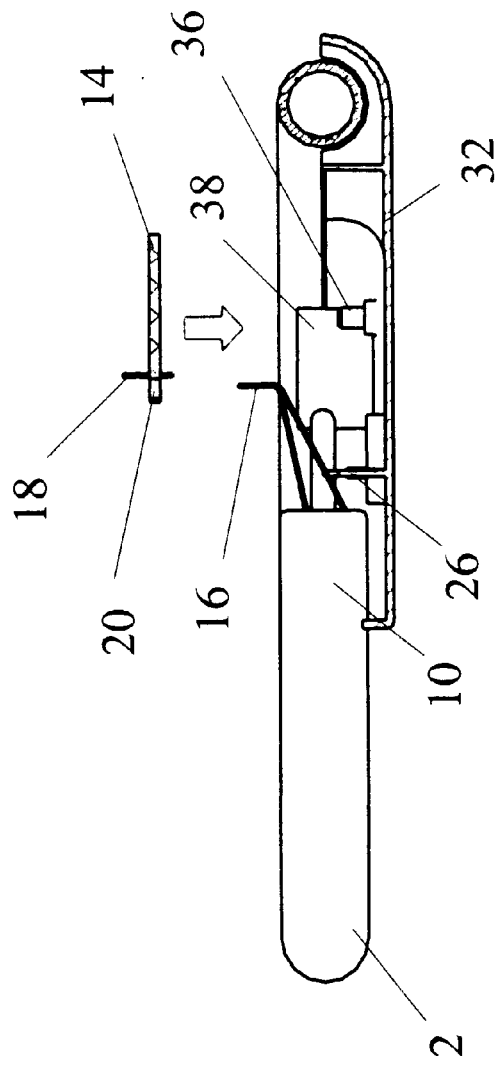
FIG. 4 shows an initial position of making the interconnect in longitudinal sectional view.

An initial position of making the electrode-to-ballast interconnect, in which the present invention is embodied, can be seen in FIG. 4. This position may be called initial one only for the sake of simple explanation. Previously, the discharge tube 2 with pre-formed electrode-in-leads 16 is put into the lower shell 32. The electrode-in-leads 16 are (pre-formed to a shape suitable for connecting to the terminals 18. Pre-forming means two suitable steps of wire bending. First, the electrode-in-leads 16 have to be straddled in horizontal direction substantially parallel to the plane in which the discharge tube 2 is bent. Second, the ends of the electrode-in-leads 16 have to be bent to a hook shape. As far as the first step of the pre-forming is concerned, it is needed on account of the sealing method of the tube ends 10. As it was described above in the background of the invention, stems embedding the electrode-in-leads 16 are sealed in both ends of a straight tube. Afterwards, the straight tube is bent to shape in the plane. Unlike pinch sealing, this method of sealing cannot ensure that both electrode-in-leads 16 protrude from the end of the discharge tube 2 in a well defined plane which is substantially parallel to the circuit board 14, i.e. the plane of the discharge tube 2, although each electrode-in-lead 16 may separately extend parallel to this plane. The electrode-in-leads 16 are badly arranged, so they have to be adjusted to a suitable shape. This shape corresponds to the position of the looms 26 and the holes 20 in the circuit board which is positioned substantially parallel to the plane of the discharge tube 2 in the base housing 22. As far as the second step of pre-forming is concerned, the electrode-in-leads 16 have to be apt to lean against the terminals 18 before welding. The hooks at the ends of the electrode-in-leads 16 allow the electrode-in-leads to get through the holes 20 of the circuit board 14 while the circuit board 14 is being inserted into the lower shell 32 during assembly. This movement is perpendicular to the plane of the circuit board 14 and is shown by an arrow.

Figure 5:
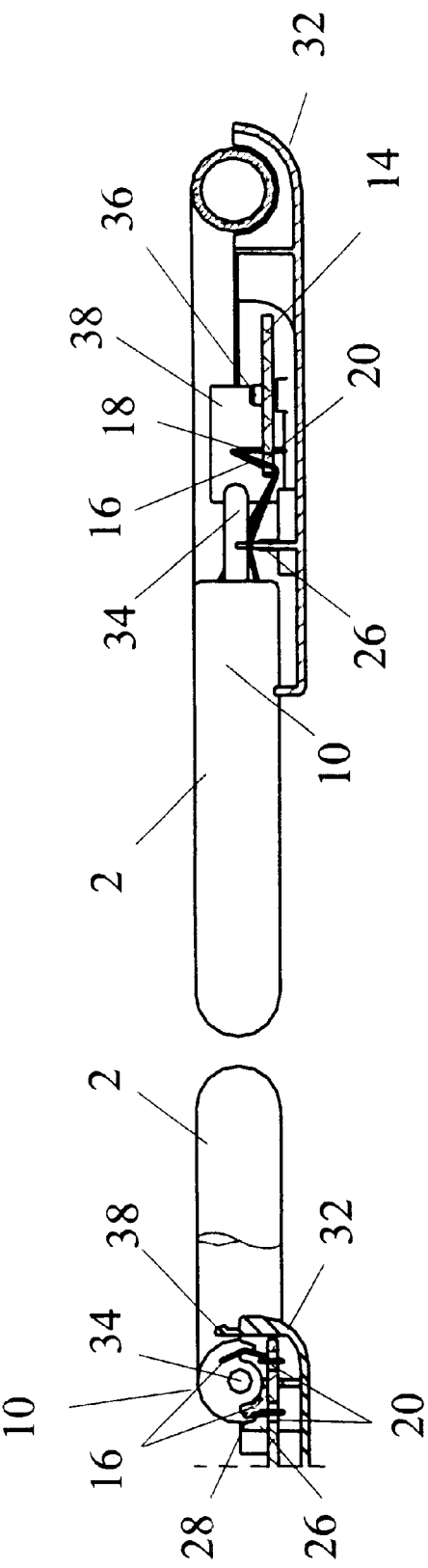
FIG. 5 shows the interconnect in longitudinal sectional view.

As it is seen in FIG. 5, when the insertion of the circuit board 14 is completed, the edges thereof snap into the grooves of the studs 36 and the circuit board 14 is held firmly at the bottom of the lower shell 32. While the circuit board 14 is being pushed into its fixed position, the holes 20 urge one end of the pre-formed electrode-in-leads 16 to lean against the terminals 18 while the looms 26 hold their other ends firmly. At the end of the process of making the electrode-to-ballast interconnect, the electrode-in-leads 16 and the terminals 18 are welded together at their contact points creating a mechanical and electrical connection between them.

Figure 6:
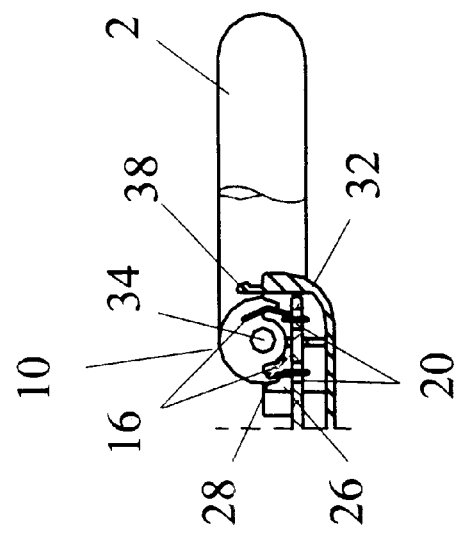
FIG. 6 shows the interconnect in half-cross sectional view.

FIG. 6 is a cross sectional view along a plane intersecting the lamp at the holes 20 in the circuit board 14. This figure clearly illustrates what the badly arranged electrode-in-leads 16 mean. The electrode-in-leads 16 are embedded in the sealed tube end 10 in a more or less random position. When the sealed discharge tube 2 with the electrode-in-leads 16 is bent in the plane during the lamp making process, the distances of the electrode-in-leads from the plane of the discharge tube 2 are different. These differences have to be equalized in the first step of pre-forming by straddling the electrode-in-leads 16 so that each electrode-in-lead 16 may be pressed into each slot 28 of a loom 26.

As FIGS. 4, 5 and 6 illustrate, the circuit board 14 is disposed within the space defined by the discharge tube 2. The lamp may be extremely flat because a part of the positioning means is formed on the circuit board 14 itself. Thus there is no need of forming separate component parts, e.g. ribs requiring additional space in the base housing 22 in order to provide for the appropriate positioning of the electrode-in-leads 16. Since the positioning means are in the vicinity of the contact points, there is no need of any additional positioning steps, too.

What is claimed is:

1. In combination with a fluorescent lamp including a discharge tube bent substantially in a plane and shaped at least in part to define a substantial portion of the boundary of a zone in the plane, the part of the tube defining the boundary including at least one straight portion, said discharge tube having a symmetry axis in the plane and sealed tube ends provided with electrodes, and the tube ends being re-entrant into said zone, a base housing laid within said zone and receiving the tube ends, the base housing including a ballast circuit located at least partly on a circuit board positioned substantially parallel to the plane, an electrode-to-ballast interconnect comprising electrode-in-leads connected to each electrode and embedded in the tube ends, terminals anchored in and protruding from the circuit board, the electrode-in-leads being pre-formed to a shape suitable for connecting to the terminals, means formed in the circuit board for urging the electrode-in-leads to the terminals during assembly, the electrode-in-leads and the terminals being joined electrically and mechanically.

2. The combination of claim 1 in which the terminals have a bridge-like shape with legs, and the legs of the bridge are anchored in the circuit board.

3. The combination of claim 1 in which the terminals protrude substantially perpendicularly from the circuit board.

4. The combination of claim 1 in which the means for urging the electrode-in-leads to the terminals during assembly are holes each formed in the vicinity of each terminal on the side thereof facing to the tube ends.

5. The combination of claim 1 in which looms protrude from an inner portion of the base housing, the looms have slots and each electrode-in-lead is pressed in each slot of a loom.

6. The combination of claim 1 in which the electrode-in-leads are pre-formed to a hook shape.

7. An integral type compact fluorescent lamp comprising a discharge tube bent substantially in a plane and including straight portions shaped to form three sides of a rectangle, said discharge tube having a symmetry axis in the plane and sealed tube ends provided with electrodes, said electrodes each being connected to electrode-in-leads, and the tube ends being re-entrant substantially symmetrically into the rectangle at the fourth side, a base housing laid within the rectangle and receiving the tube ends and including a ballast circuit located at least partly on a circuit board positioned substantially parallel to the plane, the circuit board having means formed therein for urging the electrode-in-leads to terminals of the ballast circuit during assembly, the base housing being a flat body disposed at least partly within the space defined by the discharge tube and protruding at most half of the outer diameter of the discharge tube from the space, at least one support arm extending from the base housing and attached to one of the straight portions, the base housing carrying means suitable for mechanically and electrically connecting to a socket.

8. The compact fluorescent lamp of claim 7 in which width W of the lamp measured perpendicularly to the symmetry axis and thickness T of the lamp measured perpendicularly to the plane satisfy the relationship

W/T=5.5–6.5.

9. The compact fluorescent lamp of claim 7 in which the base housing includes two complementary shells fixed to each other.

10. The compact fluorescent lamp of claim 7 in which the circuit board is disposed within the space defined by the discharge tube.

11. The compact fluorescent lamp of claim 7 in which two support arms extend from the base housing and are attached to a straight portion of the discharge tube.

\* \* \* \* \*